(12) United States Patent
Kim

(10) Patent No.: US 11,114,141 B2
(45) Date of Patent: Sep. 7, 2021

(54) CLOCK GENERATING CIRCUIT AND MEMORY DEVICE INCLUDING THE SAME

(71) Applicant: SK hynix Inc., Gyeonggi-do (KR)

(72) Inventor: Kwang-Soon Kim, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/773,594

(22) Filed: Jan. 27, 2020

(65) Prior Publication Data

US 2020/0381028 A1 Dec. 3, 2020

(30) Foreign Application Priority Data

May 31, 2019 (KR) .......................... 10-2019-0064380

(51) Int. Cl.
| | |
|---|---|
| *G11C 8/00* | (2006.01) |
| *G11C 7/22* | (2006.01) |
| *G11C 7/10* | (2006.01) |
| *H03K 5/26* | (2006.01) |
| *G11C 29/14* | (2006.01) |
| *H03K 23/68* | (2006.01) |
| *H03K 5/135* | (2006.01) |
| *G11C 11/4076* | (2006.01) |

(52) U.S. Cl.
CPC ............ *G11C 7/222* (2013.01); *G11C 7/1051* (2013.01); *G11C 7/1078* (2013.01); *G11C 11/4076* (2013.01); *G11C 29/14* (2013.01); *H03K 5/135* (2013.01); *H03K 5/26* (2013.01); *H03K 23/68* (2013.01)

(58) Field of Classification Search
CPC ..... G11C 7/222; G11C 7/1051; G11C 7/1078; G11C 11/4076; H03K 5/135; H03K 5/26; H03K 23/68

USPC .......................................................... 365/233
See application file for complete search history.

(56) References Cited

U.S. PATENT DOCUMENTS

| | | | | |
|---|---|---|---|---|
| 8,400,847 | B2* | 3/2013 | Kim ........................ | G11C 7/22 |
| | | | | 365/189.05 |
| 8,929,156 | B2* | 1/2015 | Ko .................... | G11C 29/12015 |
| | | | | 365/189.05 |
| 9,128,145 | B2* | 9/2015 | Seo ........................... | H03L 7/06 |
| 9,633,746 | B2* | 4/2017 | Kim .................... | G11C 29/028 |
| 9,761,328 | B2* | 9/2017 | Choi .................. | G11C 29/12015 |
| 10,068,624 | B2* | 9/2018 | Kwon .................. | G11C 7/1012 |
| 10,872,645 | B1* | 12/2020 | Choi ..................... | G11C 7/1051 |
| 2008/0094890 | A1* | 4/2008 | Kim ........................ | G11C 29/26 |
| | | | | 365/185.2 |
| 2009/0116300 | A1* | 5/2009 | Ha ......................... | G11C 29/48 |
| | | | | 365/189.05 |

(Continued)

FOREIGN PATENT DOCUMENTS

| | | |
|---|---|---|
| KR | 10-0520165 | 10/2005 |
| KR | 10-0891326 | 3/2009 |
| KR | 10-2019-0125749 | 11/2019 |

*Primary Examiner* — Viet Q Nguyen

(74) *Attorney, Agent, or Firm* — IP & T Group LLP

(57) ABSTRACT

A memory device includes a clock generating circuit suitable for generating a plurality of internal clock signals based on an external clock signal during an output period of read data, in response to a read command, and a data strobe output circuit suitable for outputting a first data strobe signal to a data strobe pad in response to the internal clock signals, wherein the internal clock signals toggle regardless of the output period of the read data, in response to a test mode signal.

17 Claims, 5 Drawing Sheets

(56) References Cited

U.S. PATENT DOCUMENTS

| | | | | |
|---|---|---|---|---|
| 2010/0164566 A1* | 7/2010 | Ku | ............... | H03L 7/0812 |
| | | | | 327/149 |
| 2013/0033942 A1* | 2/2013 | Ko | ............... | G11C 7/222 |
| | | | | 365/189.05 |
| 2014/0176167 A1* | 6/2014 | Seo | ............... | H03L 1/00 |
| | | | | 324/750.3 |
| 2015/0371692 A1* | 12/2015 | Song | ............... | G11C 29/028 |
| | | | | 365/189.05 |
| 2020/0143855 A1* | 5/2020 | Kim | ............... | G11C 29/12015 |
| 2020/0327929 A1* | 10/2020 | Hong | ............... | G11C 11/40615 |

\* cited by examiner

CLOCK GENERATING CIRCUIT AND MEMORY DEVICE INCLUDING THE SAME

CROSS-REFERENCE TO RELATED APPLICATION

This application claims priority under 35 U.S.C. § 119 to Korean Patent Application No. 10-2019-0064380, filed on May 31, 2019, the disclosure of which is incorporated herein by reference in its entirety.

BACKGROUND

1. Field

Various embodiments of the present invention relate generally to a memory device and, more particularly, to a memory device that inputs and outputs data based on a clock signal.

2. Description of the Related Art

As the operating speed of a memory system increases, a high-speed data transfer rate is required between memory devices in the memory system. A memory device such as a dynamic random access memory (DRAM) that operates in synchronization with a clock signal uses a method of dividing the clock signal, in order to satisfy the high-speed data transfer rate or a data high-bandwidth. A clock generating circuit in the memory device generates multi-phase clock signals having different phases by dividing the clock signal. The memory device inputs and outputs data based on the multi-phase clock signals.

Internal circuits transmitting a clock signal or data in the memory device may be implemented with various types of transistors. However, since the threshold voltage levels of the transistors may vary depending on stress, the pulse widths of the transmitted clock signal and data may be changed by the internal circuits. Therefore, the duty cycles of the transmitted clock signal and data may be distorted. Accordingly, there is a need to develop a memory device capable of more stably transmitting the clock signal and data and preventing distortion.

SUMMARY

Various embodiments of the present invention are directed to a memory device providing improved clock signal and data transmission. The memory device may prevent deterioration due to a test mode of operation (simply referred hereinafter as test mode), such as, for example, a stress test mode.

In accordance with an embodiment, a memory device may include: a clock generating circuit suitable for generating a plurality of internal clock signals based on an external clock signal during an output period of read data, in response to a read command; and a data strobe output circuit suitable for outputting a first data strobe signal to a data strobe pad in response to the internal clock signals, wherein the internal clock signals toggle regardless of the output period of the read data, in response to a test mode signal.

In accordance with an embodiment, an operating method of a memory device may include: activating an output enable signal indicating an output period of read data, in a test mode; toggling a plurality of internal clock signals based on an external clock signal, in response to the activated output enable signal; and generating a data strobe signal and outputting the generated data strobe signal to a data strobe pad in response to the internal clock signals.

In accordance with an embodiment, a memory device may include: a data strobe pad; a data pad; a clock generating circuit suitable for generating a plurality of clock signals in response to a read command to output the plurality of clock signals and toggling the plurality of clock signals in response to a test mode signal to output toggled clock signals; a data strobe output circuit suitable for receiving the plurality of internal clock signals or the toggled clock signals and outputting the received clock signals as a data strobe signal to the data strobe pad; and a data serializing circuit suitable for receiving read data from a memory cell array in response to the read command or test data in response to the test mode signal, serializing the received data to serialized output data and outputting the serialized output data to the data pad.

These and other features and advantages of the present invention will become apparent to those skilled in the art of the invention from the following detailed description in conjunction with the following drawings.

DETAILED DESCRIPTION

Figure 1:
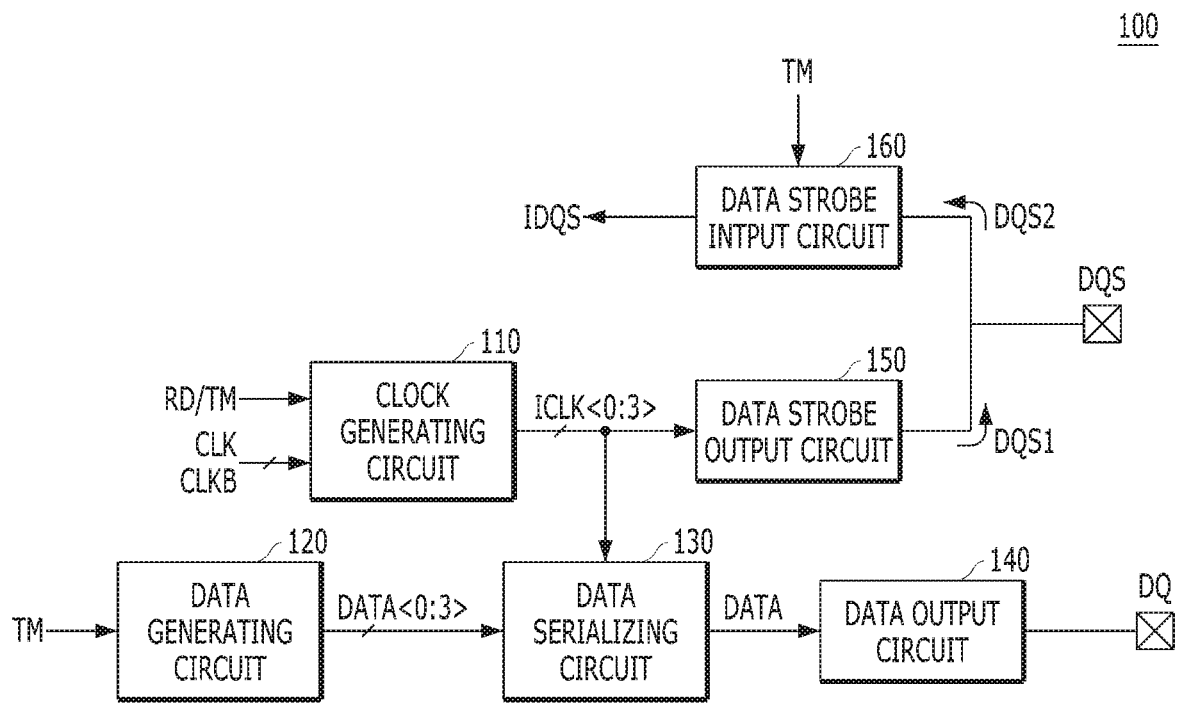
FIG. 1 is a block diagram illustrating a memory device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those with ordinary skill in the art. Throughout the disclosure, like reference numerals refer to like parts throughout the various figures and embodiments of the present invention.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

No term used in the claims herein is intended to invoke interpretation under 35 U.S.C. § 112(f), unless "means for" or "step for" is used in connection with a particular term. As used in the present specification and claims, the terms 'circuit', 'component', is 'module' and the like refer to hardware or a combination of hardware and software/firmware. More specifically, any such term can refer to any or all of the following: (a) hardware-only circuit implementations including integrated circuit(s) (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and/or (c) to circuits, such as a microprocessor(s) or a portion of a microprocessor(s), that require software or firmware for operation, even if the software or firmware is not physically present. As a further example, as used in this application, any of the above terms may also cover an implementation of merely a processor (or multiple processors) or portion of a processor and its (or their) accompanying software and/or firmware.

Hereinafter, the embodiments of the present invention will be described in more detail with reference to the drawings.

FIG. 1 is a block diagram illustrating a memory device 100 in accordance with an embodiment of the present invention. FIG. 1 illustrates a configuration related to input and output (input/output) paths of a data strobe signal and data among various configurations of the memory device 100.

The memory device 100 may read or write data under the control of a host or a memory controller (not shown). When the data is exchanged between the memory device 100 and the memory controller through such read and write operations, the data strobe signal may be used. The data strobe signal may provide a reference time for determining a logic value of the data. For example, during a high-speed data exchange, accurate determination time of the data may be checked based on the data strobe signal.

The memory device 100 may input and output the data strobe signal and the data through a data strobe pad DQS and a data pad DQ, respectively. The memory device 100 may include a clock generating circuit 110, a data generating circuit 120, a data serializing circuit 130, a data output circuit 140, a data strobe output circuit 150 and a data strobe input circuit 160.

The clock generating circuit 110 may generate a plurality of internal clock signals ICLK<0:3> based on external clock signals CLK and CLKB. When the memory device 100 performs the read and write operations, the clock generating circuit 110 may generate the internal clock signals ICLK<0:3> during an operation period. For example, the clock generating circuit 110 may generate the internal clock signals ICLK<0:3> based on the external clock signals CLK and CLKB during an output period of read data, in response to a read command RD.

According to an embodiment, the clock generating circuit 110 may allow the internal clock signals ICLK<0:3> to toggle regardless of the output period of the read data, in a test mode of the memory device 100. A test mode signal TM may indicate the test mode of the memory device 100. For example, the test mode signal TM may be activated during a wafer burn-in test operation in which stress is applied to the memory device 100 and the memory device 100 is tested.

When the read operation is performed on the memory device 100 to which the read command RD is inputted, the data may be read in parallel from a memory cell array (not illustrated). The data serializing circuit 130 may serialize the read data in response to the internal clock signals ICLK<0:3>.

During the test operation of the memory device 100, the data generating circuit 120 may generate a plurality of test data DATA<0:3>, and provide the generated test data DATA<0:3> for the data serializing circuit 130 as the read data. In response to the test mode signal TM, the data generating circuit 120 may generate the test data DATA<0:3> at a logic high level or a logic low level. The data generating circuit 120 will be described in more detail with reference to FIG. 4.

The data serializing circuit 130 may serialize the test data DATA<0:3> in response to the internal clock signals ICLK<0:3>. The data output circuit 140 may output data DATA, which is serialized by the data serializing circuit 130, to the outside through the data pad DQ.

The data strobe output circuit 150 may output a first data strobe signal DQS1 to the data strobe pad DQS in response to the internal clock signals ICLK<0:3>. The first data strobe signal DQS1 may be used to check the data outputted through the data pad DQ.

The data strobe input circuit 160 may receive a second data strobe signal DQS2 from the data strobe pad DQS, and transmit the received second data strobe signal DQS2 as an internal data strobe signal IDQS. The internal data strobe signal IDQS may be divided, and used to check the data inputted through the data pad DQ.

In the test mode of the memory device 100, the data strobe input circuit 160 may be enabled. The data strobe input circuit 160 may be enabled in response to the test mode signal TM, and receive the first data strobe signal DQS1, which is outputted by the data strobe output circuit 150, as the second data strobe signal DQS2.

As described above, the lifespan of the memory device 100 may be tested by exerting stress on the memory device 100. During the wafer burn-in test operation, high heat or high voltage may be continuously applied to the memory device 100. When the same voltage is continuously applied to the gates of PMOS and NMOS transistors constituting the memory device 100, stress may be exerted on the memory device 100. In particular, when a negative bias is continuously applied to the gate of the PMOS transistor, the PMOS transistor may deteriorate due to a negative bias temperature instability (NBTI) stress. In other words, a threshold voltage of the PMOS transistor may increase.

According to the described embodiment, even though stress is exerted on the memory device 100 and the memory device 100 is tested, the memory device 100 may be prevented from deteriorating, and the lifespan thereof may be extended. To this end, in response to the test mode signal TM of the memory device 100, the internal clock signals ICLK<0:3> may be allowed to toggle, thereby continuously outputting the data strobe signal to the data strobe pad DQS. In addition, the test data DATA<0:3> may be generated in response to the test mode signal TM, and the test data DATA<0:3> may be continuously outputted through the data pad DQ according to the toggling internal clock signals ICLK<0:3>. The memory device 100 may prevent deterioration of internal circuits provided on the clock signals and data paths for the read operation.

Furthermore, in response to the test mode signal TM of the memory device 100, the data strobe signal outputted through the data strobe pad DQS may be received as the internal data strobe signal IDQS. The internal data strobe signal IDQS may be divided, and generated as clock signals for receiving the data outputted through the data pad DQ. Therefore, the memory device 100 may also prevent the deterioration of the internal circuits provided on the clock signals and data paths for the write operation. The operations of the memory device 100 will be described in more detail with reference to FIG. 6.

Figure 2:
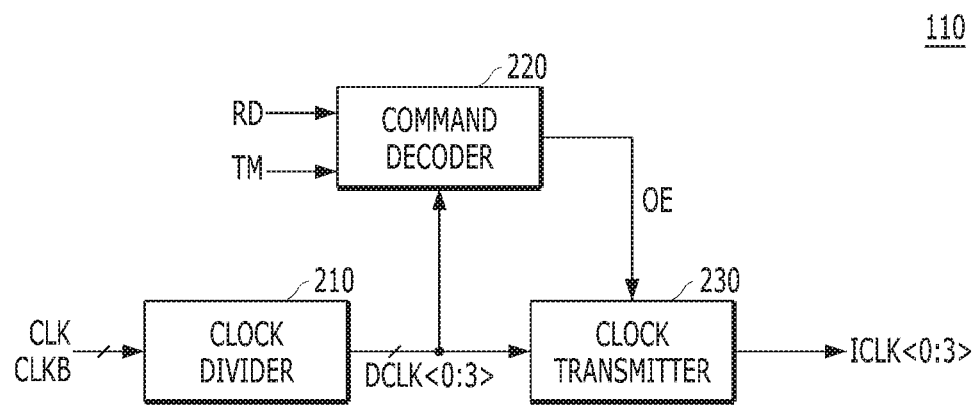
FIG. 2 is a block diagram illustrating an example of a clock generating circuit shown in FIG. 1.

FIG. 2 is a block diagram illustrating the clock generating circuit 110 of FIG. 1. Referring to FIG. 2, the clock generating circuit 110 may include a clock divider 210, a command decoder 220 and a clock transmitter 230.

The clock divider 210 may generate a plurality of divided clock signals DCLK<0:3> having different phases by dividing the external clock signals CLK and CLKB. The external clock signals CLK and CLKB may include signals that have inverted phases and periodically toggle. The clock divider 210 may generate the first to fourth divided clock signals DCLK<0:3> having a phase difference of 90°. Each of the divided clock signals DCLK<0:3> may correspond to first and second rising and falling edges of the external clock signal CLK. However, the present embodiment is not limited thereto, and may be implemented to generate various numbers of divided clock signals according to embodiments.

The command decoder 220 may generate a plurality of control signals in response to commands inputted to the memory device 100. The command decoder 220 may generate an output enable signal OE. The output enable signal OE may be activated during the output period of the read data, by decoding the read command RD based on the external clock signals CLK and CLKB. According to the described embodiment, the command decoder 220 may check input time of the read command RD, using the first to fourth divided clock signals DCLK<0:3>. The command decoder 220 may generate the output enable signal OE after a time corresponding to read latency passes from the checked input time. The output enable signal OE may be activated during a time corresponding to a burst length of data.

The clock transmitter 230 may transmit the first to fourth divided clock signals DCLK<0:3> as the first to fourth internal clock signals ICLK<0:3>, respectively, during an activation period of the output enable signal OE. The internal circuits for outputting the read data to the data pad DQ, for example, the data serializing circuit 130 of FIG. 1 may operate in synchronization with the first to fourth internal clock signals ICLK<0:3>. The data strobe output circuit 150 of FIG. 1 may generate the first data strobe signal DQS1 based on the first to fourth internal clock signals ICLK<0:3>.

The command decoder 220 may activate the output enable signal OE in the test mode of the memory device 100. In other words, the command decoder 220 may activate the output enable signal OE during an activation period of the test mode signal TM. When the output enable signal OE is activated, the clock transmitter 230 may transmit the first to fourth divided clock signals DCLK<0:3> as the first to fourth internal clock signals ICLK<0:3>, respectively. Accordingly, in the test mode of the memory device 100, the clock transmitter 230 may output the first to fourth internal clock signals ICLK<0:3> that continuously toggle.

Figure 3A:
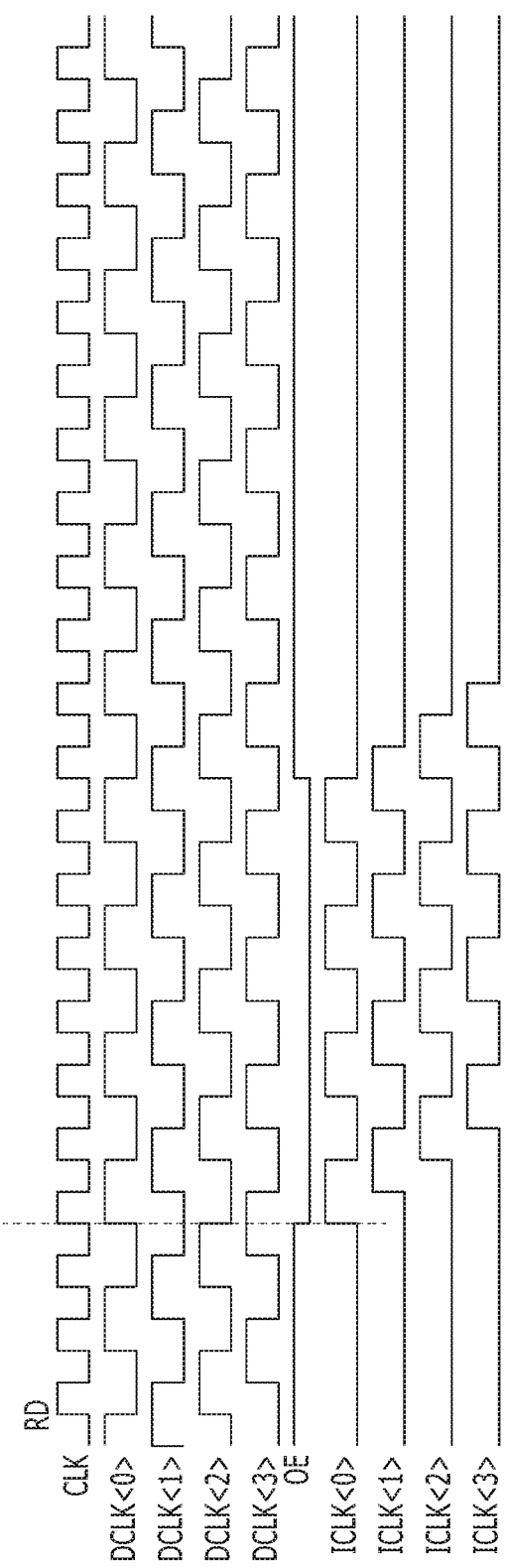
FIGS. 3A and 3B are timing diagrams illustrating an operation of the clock generating circuit of FIG. 2.
Figure 3B:
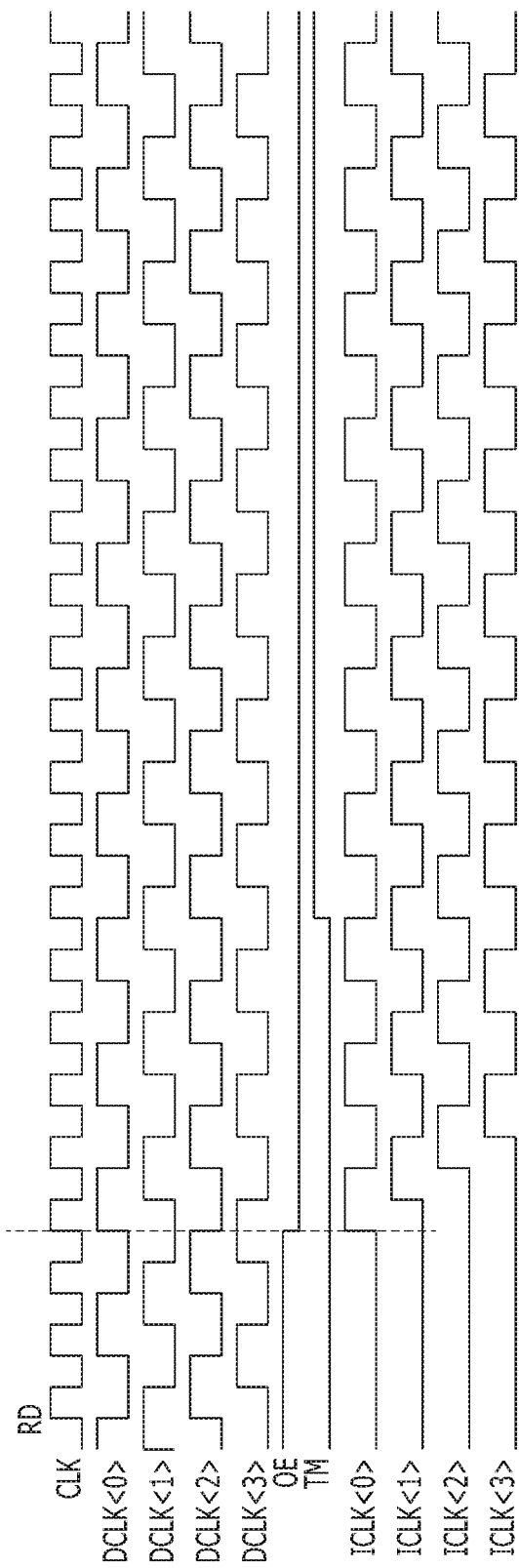

FIGS. 3A and 3B are timing diagrams illustrating an operation of the clock generating circuit 110 of FIG. 2. FIGS. 3A and 3B illustrate an operation difference of the clock generating circuit 110 according to the activation of the test mode signal TM.

Referring to FIG. 3A, the clock divider 210 of FIG. 2 may generate the first to fourth divided clock signals DCLK<0:3> having a phase difference of 90° by dividing the external clock signals CLK and CLKB. FIG. 3A illustrates only one external clock signal CLK. The first to fourth divided clock signals DCLK<0:3> correspond to the first and second rising and falling edges of the external clock signal CLK, respectively.

The command decoder 220 may generate the output enable signal OE after the time corresponding to read latency passes from the input time of the read command RD, using the first to fourth divided clock signals DCLK<0:3>. The output enable signal OE may be activated at a logic low level.

During the activation period of the output enable signal OE, the clock transmitter 230 may transmit the first to fourth divided clock signals DCLK<0:3> as the first to fourth internal clock signals ICLK<0:3>, respectively. Accordingly, the data serializing circuit 130 may be synchronized with the first to fourth internal clock signals ICLK<0:3>, and then serialize the read data.

Referring to FIG. 3B, the clock divider 210 of FIG. 2 may generate the first to fourth divided clock signals DCLK<0:3>. The command decoder 220 may generate the output enable signal OE, in response to the read command RD as described above. When the test mode signal TM is activated during the activation period of the output enable signal OE, the command decoder 220 may continue to maintain the output enable signal OE at the logic low level.

Although FIG. 3B illustrates an example in which the memory device 100 enters the test mode while performing the read operation according to the read command RD, the present embodiment is not limited thereto. The memory device 100 may enter the test mode regardless of the read operation. For example, when the test mode signal TM is activated, the command decoder 220 may generate the output enable signal OE at the logic low level.

While the output enable signal OE is maintained at the logic low level, the clock transmitter 230 may transmit the first to fourth divided clock signals DCLK<0:3> as the first to fourth internal clock signals ICLK<0:3>, respectively. Accordingly, in the test mode of the memory device 100, the data serializing circuit 130 of FIG. 1 may be synchronized with the first to fourth internal clock signals ICLK<0:3>, and continuously serialize the test data DATA<0:3>.

Figure 4:
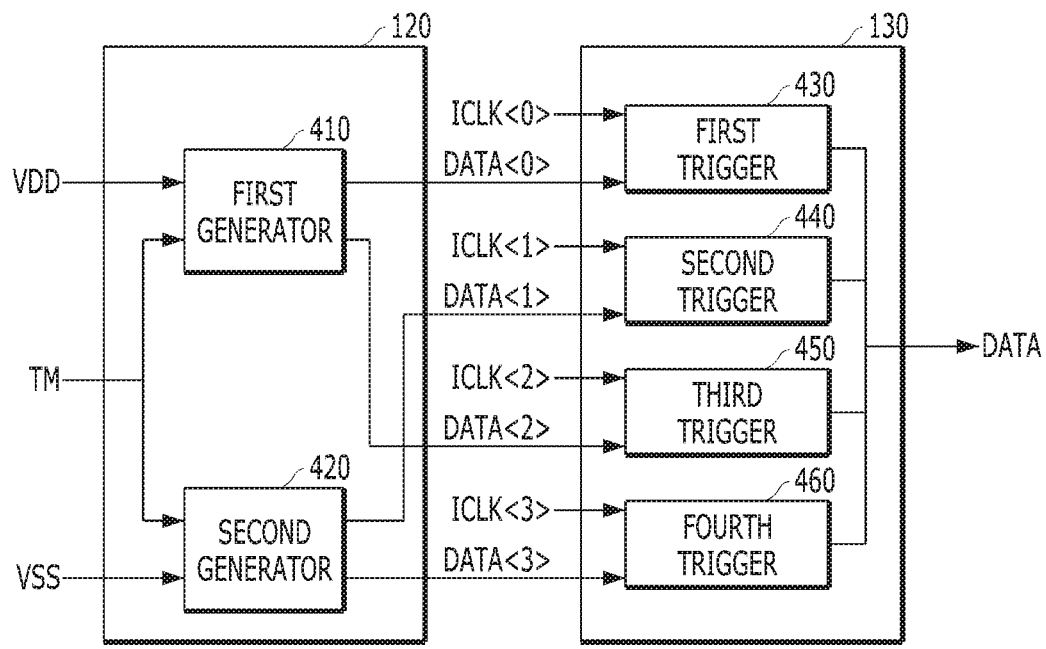
FIG. 4 is a block diagram illustrating an example of a data generating circuit and an example of a data serializing circuit of FIG. 1.

FIG. 4 is a block diagram illustrating an example of the data generating circuit 120 and the data serializing circuit 130 of FIG. Referring to FIG. 4, the data generating circuit 120 may include first and second generators 410 and 420, and the data serializing circuit 130 may include first to fourth triggers 430 to 460.

During the test operation of the memory device 100, the first generator 410 may generate the first and third data DATA<0> and DATA<2> of the test data DATA<0:3> at a logic high level. In response to the test mode signal TM, the first generator 410 may generate the first and third data DATA<0> and DATA<2>, using a power supply voltage VDD. When the test mode signal TM is activated, the first generator 410 may couple a node of the power supply voltage VDD to nodes of the first and third data DATA<0> and DATA<2>.

During the test operation of the memory device 100, the second generator 420 may generate the second and fourth data DATA<1> and DATA<3> of the test data DATA<0:3> at a logic low level. In response to the test mode signal TM, the second generator 420 may generate the second and fourth data DATA<1> and DATA<3>, using a ground voltage VSS. When the test mode signal TM is activated, the second generator 420 may couple a node of the ground voltage VSS to nodes of the second and fourth data DATA<1> and DATA<3>.

The first to fourth triggers 430 to 460 may transmit the first to fourth data DATA<0:3> to an output node in response to the first to fourth internal clock signals ICLK<0:3>, respectively. In response to the first to fourth internal clock signals ICLK<0:3> having the phase difference of 90°, the first to fourth triggers 430 to 460 may serialize the first to fourth data DATA<0:3>, which are inputted in parallel, and output the serialized data DATA.

Figure 5:
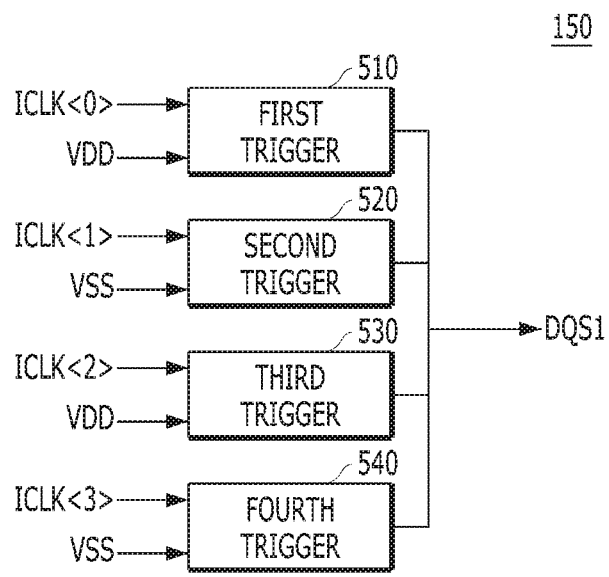
FIG. 5 is a block diagram illustrating an example of a data strobe output circuit of FIG. 1.

FIG. 5 is a block diagram illustrating the data strobe output circuit 150 of FIG. 1. Referring to FIG. 5, the data strobe output circuit 150 may include first to fourth triggers 510 to 540.

The first and third triggers 510 and 530 may drive the first data strobe signal DQS1 with the power supply voltage VDD in response to the first and third internal clock signals ICLK<0> and ICLK<2>, respectively. The first and third triggers 510 and 530 may couple the node of the power supply voltage VDD to a node of the first data strobe signal DQS1 in response to the first and third internal clock signals ICLK<0> and ICLK<2>, respectively.

The second and fourth triggers 520 and 540 may drive the first data strobe signal DQS1 with the ground voltage VSS in response to the second and fourth internal clock signals ICLK<1> and ICLK<3>, respectively. The second and fourth triggers 520 and 540 may couple the node of the ground voltage VSS to the node of the first data strobe signal DQS1 in response to the second and fourth internal clock signals ICLK<1> and ICLK<3>, respectively.

The first to fourth triggers 510 to 540 may output the first data strobe signal DQS1 that toggles between the levels of the power supply voltage VDD and the ground voltage VSS, in response to the first to fourth internal clock signals ICLK<0:3> having the phase difference of 90°. The first data strobe signal DQS1 may be outputted to the outside of the memory device 100 through the data strobe pad DQS.

Figure 6:
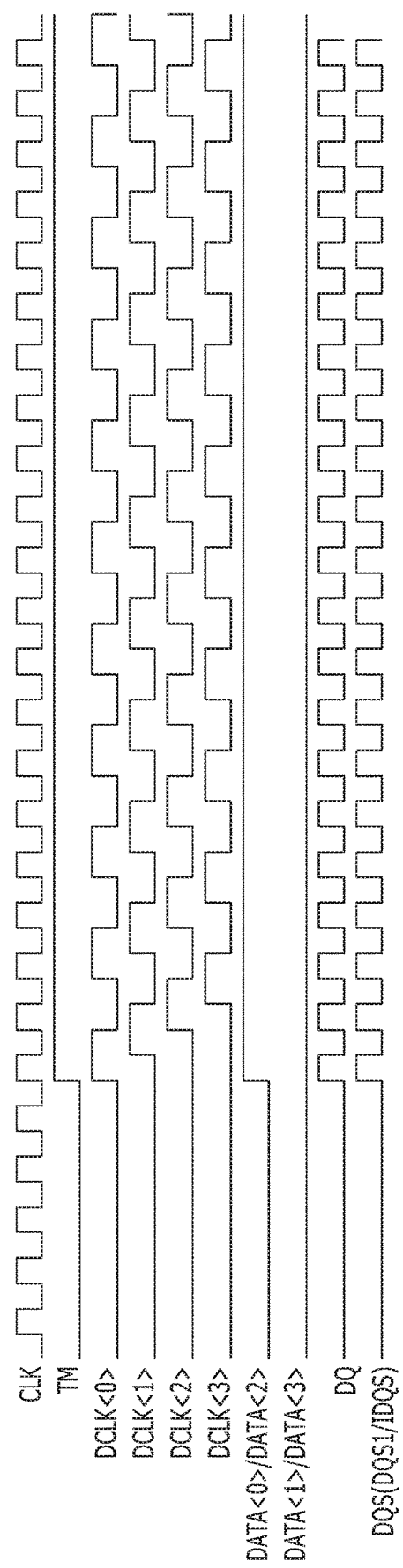
FIG. 6 is a timing diagram illustrating an operation of a memory device in accordance with an embodiment of the present invention.

FIG. 6 is a timing diagram illustrating an operation of the memory device 100 in accordance with an embodiment of the present invention.

Referring to FIG. 6, when the memory device 100 enters the test mode, the test mode signal TM may be activated. When the test mode signal TM is activated, the clock generating circuit 110 of FIG. 1 may allow the first to fourth internal clock signals ICLK<0:3> to toggle based on the external clock signal CLK. The first to fourth internal clock signals ICLK<0:3> may toggle with the phase difference of 90°, corresponding to the first and second rising and falling edges of the external clock signal CLK.

When the test mode signal TM is activated, the data generating circuit 120 may generate the first to fourth data DATA<0:3>. The first to fourth data DATA<0:3> may be generated at different logic levels between neighboring data. In other words, the first and third data DATA<0> and DATA<2> of the first to fourth data DATA<0:3> may be generated at a logic high level, and the second and fourth data DATA<1> and DATA<3> of the first to fourth data DATA<0:3> may be generated at a logic low level.

The data serializing circuit 130 may serialize the first to fourth data DATA<0:3> in response to the first to fourth internal clock signals ICLK<0:3> that toggle. The serialized data DATA may be outputted to the outside of the memory device 100 through the data pad DQ. In FIG. 6, the data outputted through the data pad DQ are denoted by the same reference symbol 'DQ'.

The data strobe output circuit 150 may generate the first data strobe signal DQS1, and output the generated first data strobe signal DQS1 to the data strobe pad DQS, in response to the first to fourth internal clock signals ICLK<0:3> that toggle. When the test mode signal TM is activated, the data strobe input circuit 160 may be enabled, and transmit the first data strobe signal DQS1 as the internal data strobe signal IDQS. In FIG. 6, the data strobe signals outputted through the data strobe pad DQS are denoted by the same reference symbol 'DQS'. In the test mode, the first data strobe signal DQS1 and the internal data strobe signal IDQS may have the same phase, and be denoted by the data strobe signal DQS of FIG. 6.

In accordance with the described embodiments, during the test operation of a memory device, internal clock signals may be allowed to toggle, and thus a data strobe signal may be continuously outputted through a data strobe pad. In addition, data to be outputted through a data pad may be generated and outputted based on the toggling internal clock signals. Therefore, internal circuits on the data output path, that is, a data output circuit and a clock signal transmitting circuit may be prevented from deteriorating due to the test operation of the memory device.

In addition, during the test operation of the memory device, the data strobe signal outputted to the data strobe pad may be inputted as an internal data strobe signal. The internal data strobe signal may be divided, and used as clock signals for receiving data outputted to the data pad. Therefore, internal circuits on the data input path, that is, a data input circuit and a clock signal transmitting circuit may also be prevented from deteriorating due to the test operation of the memory device.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure as set forth in the following claims.

What is claimed is:

1. A memory device comprising:
    a clock generating circuit suitable for generating a plurality of internal clock signals based on an external clock signal during an output period of a read data, in response to a read command;
    a data strobe output circuit suitable for outputting a first data strobe signal to a data strobe pad in response to the internal clock signals;
    a data generating circuit suitable for generating a plurality of test data and outputting the generated test data as the read data, in response to a test mode signal; and
    a data serializing circuit suitable for serializing the read data in response to the internal clock signals,
    wherein the internal clock signals toggle regardless of the output period of the read data, in response to the test mode signal.

2. The memory device of claim 1, wherein the clock generating circuit comprises a command decoder suitable for decoding the read command based on the external clock signal to generate an output enable signal, which is activated during the output period of the read data.

3. The memory device of claim 2, wherein the command decoder activates the output enable signal during an activation period of the test mode signal.

4. The memory device of claim 2, wherein the command decoder activates the output enable signal during a time corresponding to the output period of the read data after a time corresponding to a read latency passes from the input time of the read command.

5. The memory device of claim 2, wherein the clock generating circuit further comprises:
   a clock divider suitable for dividing the external clock signal to generate first to fourth divided clock signals having a phase difference of 90°; and
   a clock transmitter suitable for transmitting the first to fourth divided clock signals as the internal clock signals during an activation period of the output enable signal.

6. The memory device of claim 1, wherein the data generating circuit comprises:
   a first generator suitable for generating first and third data among the test data at a logic high level in response to the test mode signal; and
   a second generator suitable for generating second and fourth data among the test data at a logic low level in response to the test mode signal.

7. The memory device of claim 6, wherein the data serializing circuit comprises:
   a first trigger suitable for transmitting the first data to an output node in response to a first clock signal of the internal clock signals;
   a second trigger suitable for transmitting the second data to the output node in response to a second clock signal of the internal clock signals;
   a third trigger suitable for transmitting the third data to the output node in response to a third clock signal of the internal clock signals; and
   a fourth trigger suitable for transmitting the fourth data to the output node in response to a fourth clock signal of the internal clock signals.

8. The memory device of claim 1, further comprising a data strobe input circuit suitable for receiving a second data strobe signal from the data strobe pad, and transmitting the received second data strobe signal as an internal data strobe signal.

9. The memory device of claim 8, wherein the data strobe input circuit is enabled in response to the test mode signal, and receives the first data strobe signal as the second data strobe signal.

10. The memory device of claim 1, wherein the data strobe output circuit comprises:
    a first trigger suitable for driving the first data strobe signal with a power supply voltage in response to a first clock signal of the internal clock signals;
    a second trigger suitable for driving the first data strobe signal with a ground voltage in response to a second clock signal of the internal clock signals;
    a third trigger suitable for driving the first data strobe signal with the power supply voltage in response to a third clock signal of the internal clock signals; and
    a fourth trigger suitable for driving the first data strobe signal with the ground voltage in response to a fourth clock signal of the internal clock signals.

11. The memory device of claim 1, wherein the test mode signal is activated during a wafer burn-in test of the memory device.

12. An operating method of a memory device comprising:
    activating an output enable signal indicating an output period of read data, in a test mode;
    toggling a plurality of internal clock signals based on an external clock signal, in response to the activated output enable signal;
    generating a data strobe signal and outputting the generated data strobe signal to a data strobe pad in response to the internal clock signals;
    generating a plurality of test data in the test mode; and
    serializing and outputting the plurality of test data to have different logic levels between neighboring test data in response to the internal clock signals.

13. The operating method of claim 12, wherein the toggling of the plurality of internal clock signals based on the external clock signal, in response to the activated output enable signal comprises:
    dividing the external clock signal to generate first to fourth divided clock signals having a phase difference of 90°; and
    transmitting the first to fourth divided clock signals as the internal clock signals during an activation period of the output enable signal.

14. The operating method of claim 12, further comprising receiving the data strobe signal and transmitting the received data strobe signal as an internal data strobe signal in the test mode.

15. The operating method of claim 12, wherein the test mode comprises a wafer burn-in test mode of the memory device.

16. The operating method of claim 12, wherein the output enable signal is activated during a time corresponding to the output period of the read data during a read operation.

17. A memory device comprising:
    a data strobe pad;
    a data pad;
    a clock generating circuit suitable for generating a plurality of clock signals in response to a read command to output the plurality of clock signals and toggling the plurality of clock signals in response to a test mode signal to output toggled clock signals;
    a data strobe output circuit suitable for receiving the plurality of internal clock signals or the toggled clock signals and outputting the received clock signals as a data strobe signal to the data strobe pad; and
    a data serializing circuit suitable for receiving read data from a memory cell array in response to the read command or test data in response to the test mode signal, serializing the received data to serialized output data and outputting the serialized output data to the data pad.

* * * * *